(12) United States Patent
Baumgartner et al.

(10) Patent No.: US 6,553,514 B1
(45) Date of Patent: Apr. 22, 2003

(54) DIGITAL CIRCUIT VERIFICATION

(75) Inventors: Jason Raymond Baumgartner, Austin, TX (US); Nadeem Malik, Austin, TX (US); Steven Leonard Roberts, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/404,281

(22) Filed: Sep. 23, 1999

(51) Int. Cl.$^7$ ............................................... H02H 3/05
(52) U.S. Cl. ......................... 714/32; 714/33; 714/724; 714/741; 703/13; 703/14; 703/15; 703/16; 716/4; 716/5
(58) Field of Search ............................. 714/21, 32, 33, 714/741, 724; 703/15, 13–16; 716/4, 5

(56) References Cited

U.S. PATENT DOCUMENTS

| | | | | |
|---|---|---|---|---|
| 5,426,651 A | * | 6/1995 | Van De Burgt | 714/724 |
| 5,926,622 A | * | 7/1999 | Hardin et al. | 714/33 |
| 6,049,662 A | * | 4/2000 | Saha et al. | 703/16 |
| 6,074,426 A | * | 6/2000 | Baumgartner et al. | 703/13 |
| 6,205,559 B1 | * | 3/2001 | Sakaguchi | 714/33 |

OTHER PUBLICATIONS

Burch et al., "Symbolic Model Checking for Sequential Circuit Verification," Apr. 1994, IEEE Transactions on Computer–Aided Design of Integrated Circuits and Systems, vol. 13, pp. 401–424.*

* cited by examiner

Primary Examiner—Robert Beausoliel
Assistant Examiner—Michael Maskulinski
(74) Attorney, Agent, or Firm—Joseph P. Lally; Mark E. McBurney

(57) ABSTRACT

A method of verifying a digital circuit in which state transition information is extracted from the output of a non-formal first verification technique. A formal verification tool is then applied to the extracted state transition information to extend the verification coverage of the digital circuit beyond the coverage that is achieved using the first verification technique. In one embodiment, the method includes the initial step of applying a first verification technique such as a simulation technique to a model of the digital circuit. In the preferred embodiment, the application of the formal verification tool comprises applying a model checker to the extracted state transition data to achieve a formal verification of the state machine represented by the state transition diagram. In one embodiment, the extracted state transition information includes a set of data points each representing a present state, a present input, and a next state. In one embodiment useful for extending the verification coverage provided by a conventional non-formal verification technique, the non-formal tool is used to verify satisfaction of a specification or rule by traversing a first transition path of the circuit. The non-formal tool is then used a second time to verify the rule or specification by traversing a second transition path. State transition information generated during the first and second passes of the non-formal verification technique is then extracted and provided to a formal verification tool such as a model checker. The formal verification of the circuit represented by the extracted state transition information extends the verification coverage achieved with the non-formal verification tool such as by, for example, traversing the digital circuit with a third transition path that was not explored with the non-formal verification tool. In addition, infinite loop conditions or live lock conditions may be detected by applying the formal verification technique to the extracted state transition information. Extraction and archiving of transition information may be performed periodically to accumulate new transition information.

27 Claims, 5 Drawing Sheets

A, 506a, B   A, 506e, C
B, 506b, C   C, 506f, E
C, 506c, D   E, 506g, A
D, 506e, A

DIGITAL CIRCUIT VERIFICATION

BACKGROUND

1. Field of the Present Invention

The present invention relates to the field of logic design verification and more particularly to a method for extending the verification coverage achieved with traditional non-formal verification techniques such as simulation.

2. History of Related Art

Verification of digital hardware is generally accomplished by a simulation technique in which a given set of input test vectors is applied to a model of the circuit to be verified. Traditional simulation, however, is significantly limited in its ability to completely verify complex hardware. The number of states, state transitions, and state transition sequences associated with any particular digital circuit all increase exponentially as the model size, calculated in terms of the number of latches comprising the model, increases linearly. Referring to FIG. 1, a state transition diagram 100 representing various states and transition paths between the various states for a given logic design is presented where a transition path is defined as a sequence of one or more transitions and a transition is defined as a single step from a present state to a next state under control of the present input. State transition diagram 100 includes an initial state 102a and multiple transition paths 104a, 104b, and 104c, leading from initial transition state 102a to next transition states 102b, 102c, and 102d. Each of the states 102b, 102c, and 102d can transition to other states indicated in transition table 100 through the various transition paths. It will be appreciated by those skilled in the field of digital hardware design that state transition diagram 100 of FIG. 1 is a grossly simplified representation of the state machines contemplated by complex digital circuitry. It will be further appreciated that the number of transition states 102 and, correspondingly, the number of transition paths 104 increases exponentially with the number of latches, such that even a moderately complex circuit comprised of, for example, 1000 latches can assume $2^{1000}$ or roughly $10^{300}$ states. Traditionally, conventional simulation techniques verify a given digital circuit in a depth-first fashion. As an example, a simulation technique might attempt to verify the digital circuit represented by state diagram 100 by applying a sequence of inputs to a model of the digital circuit and recording the transition paths that the model follows. Thus, for example, a given simulation trace may follow the digital circuit from an initial state 102a through intermediate states 102c and 102e to a final state 102f via transition paths 104b, 104d and 104e. If any rules or specifications with which the digital circuit must comply are violated along the transition path indicated from initial state 102a to final state 102f, the simulation trace indicated will identify the violation. As the number of states and transition paths increases exponentially with the number of latches in the circuit, achieving any significant coverage of the total number of available transition paths quickly becomes exceedingly difficult using conventional simulation techniques because each simulation run exposes only a single transition path. Circuit simulation is commonly referred to as a non-formal verification technique to emphasize the limited coverage achieved using such a technique. At the other end of the verification spectrum, formal verification tools and techniques are used to rigorously verify that an implantation satisfies a given specification or set of rules. Typically, a formal verification technique utilizes a breadth-first approach in which each possible transition path from a given transition state is verified before proceeding to another state (or set of states) in the machine. In the depiction of FIG. 1, for example, a formal verification technique might begin by verifying transition paths 104a, 104b, and 104c with respect to state 102a before proceeding to the second "tier" of states including states 102b, 102c, and 102d. After verifying each transition path 104 leading from the second tier of states, a formal verification tool might verify each transition path extending from the second tier of states to the third tier, and so forth. In this manner, a formal verification technique verifies essentially every permitted combination of transitions in state diagram 100. While formal verification tools and techniques obviously enjoy the advantage of the greatest possible coverage of the digital circuit being verified, it will be readily appreciated that the computational load contemplated by a full formal verification of a digital circuit with any significant complexity can quickly become overwhelming. Typically, therefore, formal verification tools are utilized in conjunction with an environment that is associated with the design to be verified. A model, such as an HDL model is imported into a formal verification tool such as a model checker. A verification engineer then constructs an environment around the design consisting of a variety of input constraints associated with the circuit. In addition, a set of properties or rules to be verified is supplied to the formal verification tool. The verification tool will then extract the full state transition table for the design limited by the environmental constraints. While this type of formal verification provides the desirable level of verification coverage, the construction of the environment around the design is a manually intensive, arduous, and time consuming process. It is therefore highly desirable to implement a verification technique striking a reasonable compromise between the limited coverage afforded by conventional simulation techniques and the expense and time consumed by formal verification methods.

SUMMARY OF THE INVENTION

The problems identified above are in large part addressed by a verification method according to the present invention in which a conventional non-formal verification tool is utilized to generate information from which a partial state transition diagram of the circuit to be verified can be extracted. A formal verification tool such as a model checker is then used to achieve formal verification of the portion of the circuit represented by the extracted state transition information. By combining non-formal with formal verification techniques, the invention is able to achieve additional verification coverage over the coverage provided by traditional simulation with only an incremental increase in the amount of time and expense required to generate the simulation.

Broadly speaking, the present invention contemplates the use of a two stage verification process in which the second stage augments verification coverage obtained by the first stage in an automatic fashion. In the first stage, state transition information is extracted from the output of a non-formal verification technique. A formal verification tool is then applied to the extracted state transition information to extend the verification coverage of the digital circuit beyond the coverage that is achieved using the first verification technique. In one embodiment, the method includes the initial step of applying a first verification technique such as a simulation technique to a model of the digital circuit. In one embodiment, the information from which the state transition information is extracted includes an all events trace that is produced by executing a set or plurality of simulation runs using the simulation tool or technique. In the preferred embodiment, the application of the formal verification tool comprises applying a model checker to the extracted state transition data to achieve a formal verification of the state machine represented by the state transition diagram. In one embodiment, the extracted state transition information includes a set of data points each representing a present state, a present input, and a next state. Preferably, the state transition information is sorted by the present state information to facilitate a breadth-first verification by the formal verification tool. In one embodiment useful for extending the verification coverage provided by a conventional non-formal verification technique, the non-formal tool is used to verify satisfaction of a specification or rule by traversing a first transition path of the circuit. The non-formal tool is then used a second time to verify the rule or specification by traversing a second transition path. State transition information generated during the first and second passes of the non-formal verification technique is then extracted and provided to a formal verification tool such as a model checker. The formal verification of the circuit represented by the extracted state transition information extends the verification coverage achieved with the non-formal verification tool such as by, for example, traversing the digital circuit with a third transition path that was not explored with the non-formal verification tool. In addition, infinite loop conditions or live lock conditions may be detected by applying the formal verification technique to the extracted state transition information. The invention further contemplates a computer system and a computer program product such as a computer readable medium for implementing the method of verifying digital circuits described herein.

Figure 1:
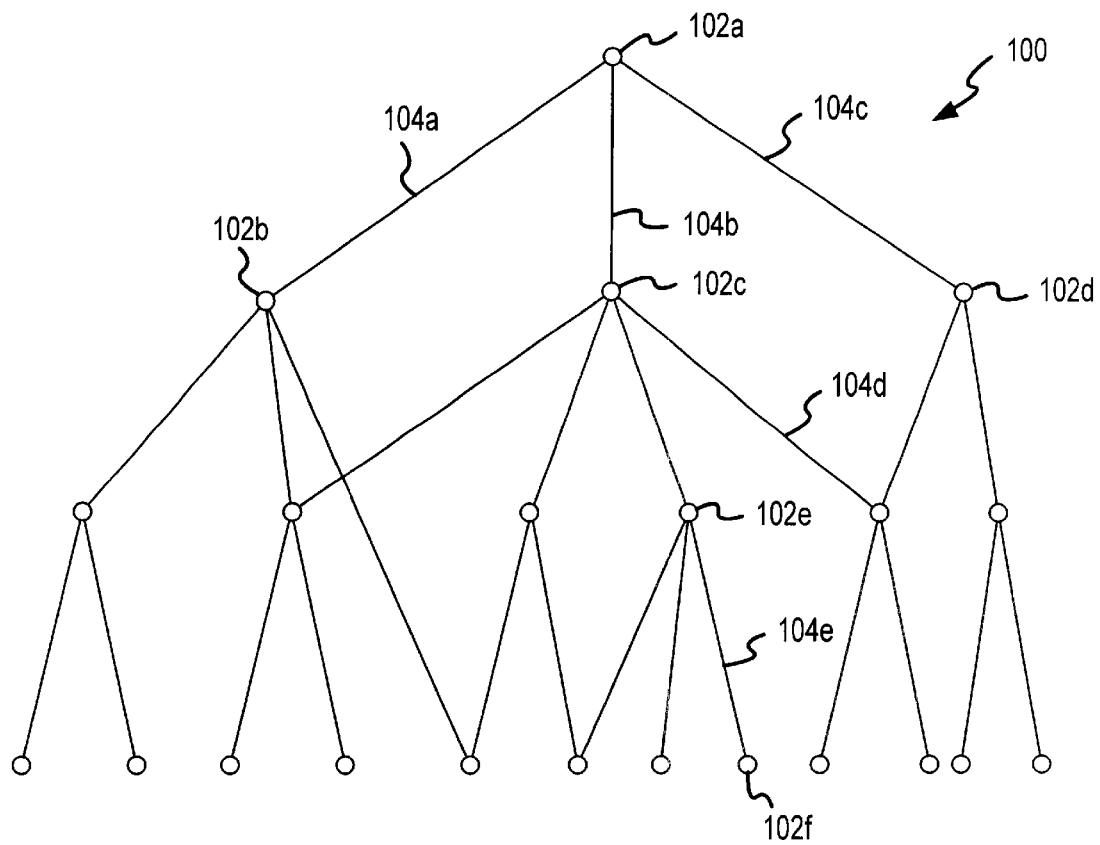
FIG. 1 is a state transition diagram for a digital circuit.

Other objects and advantages of the invention will become apparent upon reading the following detailed description and upon reference to the accompanying drawings in which:

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF A PREFERRED EMBODIMENT OF THE PRESENT INVENTION

Figure 2:
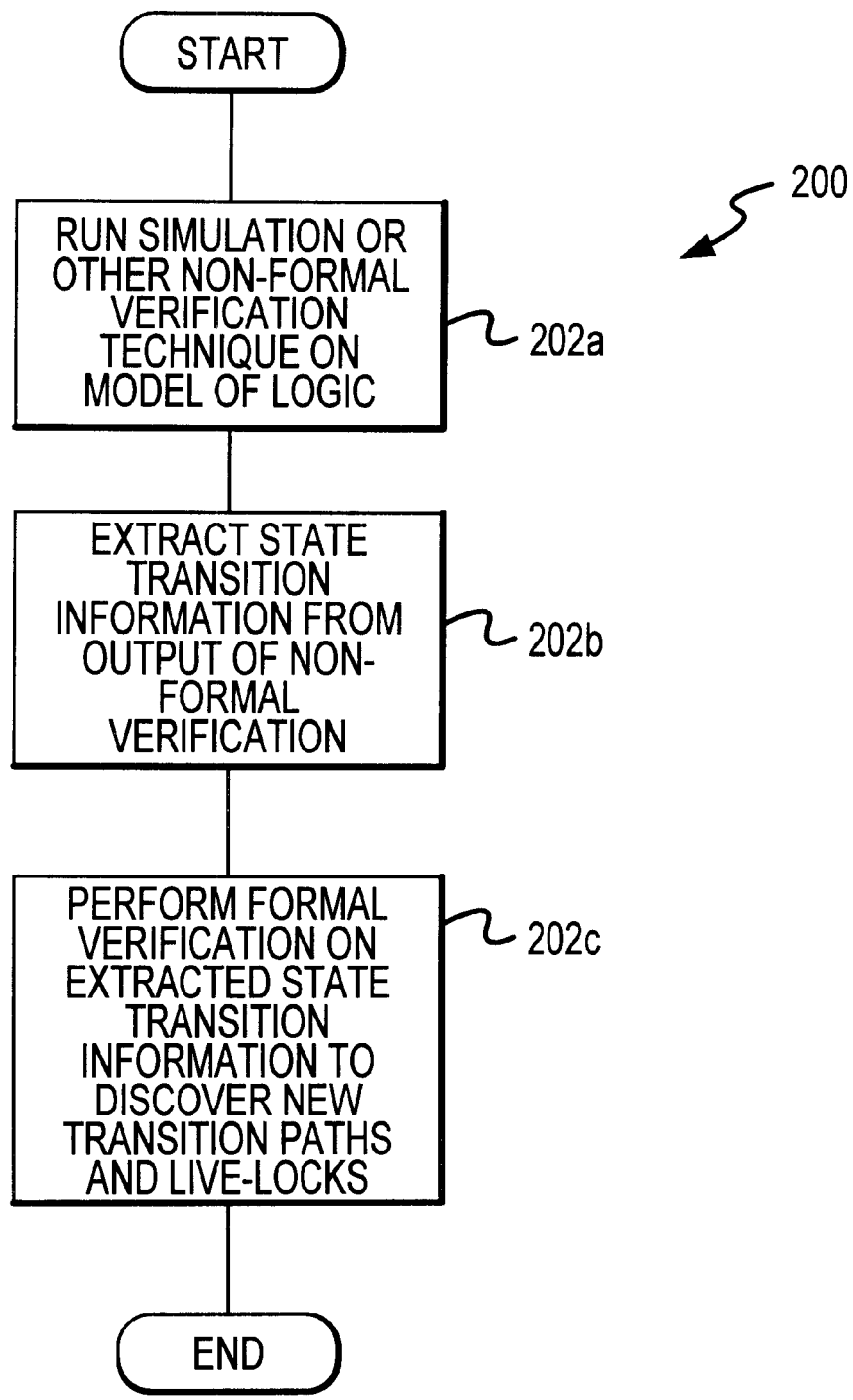
FIG. 2 is a flow diagram of a method of verifying a digital circuit according to one embodiment of the present invention.

Turning now to the drawings, FIG. 2 presents a flow diagram of a method 200 according to one embodiment of the invention in which existing non-formal and formal verification tools and techniques are utilized to extend the verification coverage of a model of a digital circuit without consuming the time or expense required for a formal verification of the circuit. In the embodiment depicted in FIG. 2, method 200 includes an initial step in which a non-formal verification technique is run or executed on a model such as an HDL model of a digital circuit in step 202a. In one presently preferred embodiment, the non-formal verification technique comprises a conventional simulation methodology in which one or more sets of input sequences are applied to the digital circuit model to generate one or more simulation traces representative of the state transitions that would be observed if the specified input sequence were applied to the digital circuit. A non-formal verification technique, as used in this disclosure, refers to a verification method, such as a simulation technique, that does not exhaustively verify all possible permitted transition paths that the digital circuit may experience. In the preferred embodiment, the non-formal verification technique generates output in the form of a simulation trace or other information containing state transition information indicative of the state transition path produced by the specified input sequence. Although the flow diagram of FIG. 2 indicates step 202a as an integral part of method 200, it will appreciated that step 202a may be preformed wholly independent of the extraction process discussed below with respect to step 202b.

The state transition information generated in step 202a is then extracted (step 202b) from the output of the simulation program or other non-formal verification technique. The state transition information is suitably stored in a container such as a binary decision diagram or hash table suitable for representing transition information. Although the embodiment of flow diagram 200 depicted in FIG. 2 indicates a single extraction step 202b, one embodiment of the invention contemplates periodic updating of the state transition information. In this embodiment, after initial state transition information is extracted from the simulation output, additional simulation runs are preformed thereby presumably producing simulation traces associated with state transitions that were not encountered in the initial simulation. The updating of the state transition information can be preformed cumulatively such that only new transition information is added to the extracted state transition information. Thus, while simulation is likely in many instances to expose the same state transitions many times, each unique transition is stored in the state transition information only once. It will be appreciated that the state transition information extracted in step 202b provides a suitable representation of the portion of the digital circuit that was simulated in step 202a. Despite its limitation with respect to complete verification coverage, simulation techniques are readily available and suitable for producing a significant quantity of information about the digital circuit. Moreover, because this state transition information is produced by the simulation tool itself, there is no need to expend excessive resources developing an environment around the device circuit to constrain the inputs that may be applied to the circuit.

After extracting the state transition information in step 202b, a formal verification is preformed (step 202c) on the extracted state transition information. In this manner, a formal verification of a portion of the digital circuit represented by the state transition information is made possible. A formal verification of state transition information generated using a simulation techniques is useful in discovering transition paths the were not explicitly simulated in step 202a. The formal verification of step 202c is preferably accomplished by importing the state transition information into a formal verification tool such a model checker and utilizing the model checker to perform a breadth-first verification of the partial circuit represented by the state transition information. As discussed further below, the formal verification process of step 202c is useful in uncovering transition paths discernible from the state transition information that were not explicitly simulated. In addition, the formal verification of step 202c is useful in uncovering infinite loop or live lock conditions inherent in the digital circuit. As indicated previously, this extended verification coverage is achieved by merely extracting information that was provided by the simulation technique. This eliminates the need to generate an extensive environment around the digital circuit under test thereby saving significant resources and generally expediting the verification process.

Figure 3:
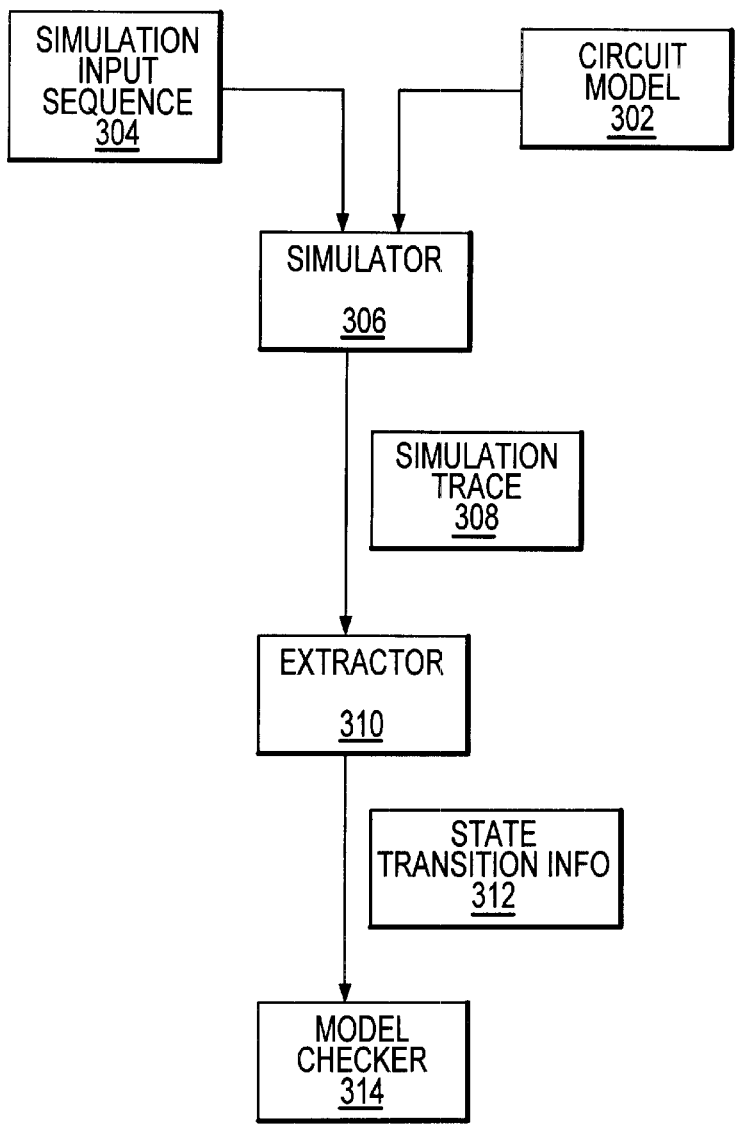
FIG. 3 is a conceptual representation of a verification system according to one embodiment of the present invention.
Figure 4:
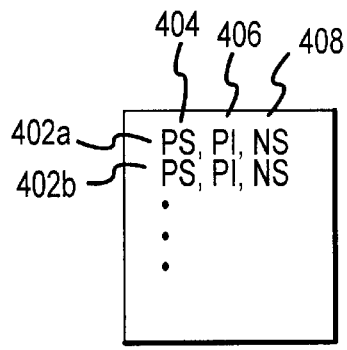
FIG. 4 is a representation of one embodiment of a format for state transition information extracted with the system of FIG. 3.

Turning to FIG. 3, a conceptual representation of a verification system 300 utilizing the method or process 200 described with respect to FIG. 2 is presented. In this depiction, verification system 300 includes a simulator 306, an extractor 310, and a model checker 314. The simulator 306 receives a circuit model 302 and one or more simulation input sequences 304 as inputs. The circuit model 302 may comprise an HDL model of the digital circuit or a portion of the digital circuit being verified. The simulation input sequence 304 represents user generated or computer generated input sequences that are designed to exercise various components and features of the digital circuit. In the early stage of the verification process, the simulation input sequences 304 are suitably provided by the designer or designers of the digital circuit. The circuit designers will typically have the most intimate knowledge of the digital circuit design and will likely have a number of input sequences in mind to exercise the various major components of the digital circuit. While simulating these expected input sequences provides valuable information about the digital circuit, reliance on known input sequences is typically inadequate to anticipate and simulate circuit behavior when an unexpected input sequence is applied to the digital circuit. Thus, verification system 300 indicates a simulator 306 receiving simulation input sequence or sequences 304 and circuit model 302 and producing a simulation trace indicated by reference numeral 308. Frequently, the information stored in simulation traces 308 produced by applying a conventional or expected series of input sequences 304 to circuit model 302 will contain sufficient information to enable exploration of circuit behavior that was not explicitly simulated with input sequences 304. In one embodiment, simulation traces 308 include state transition information of the format indicated in FIG. 4 represented by reference numeral 312. In this environment, state transition information 312 includes a set of transition information data points 402a, 402b . . . (collectively or generically referred to herein as data points 402). Each transition information data point includes present state information 404, present input information 406, and next state information 408. As their names imply, present state information 404 conveys the state of all latches in the digital circuit being verified while present input 406 indicates the inputs that are being applied to the digital circuit. The next state information 408 indicates the state to which the digital circuit transitioned in response to the present inputs indicated by present input information 406. Those familiar with the characterization of computing systems as sophisticated state machines will appreciate that the state transition information 312 formatted as indicated in FIG. 4 is sufficient to describe the behavior of the digital circuit with respect to the input sequences that were explicitly simulated. In addition, however, the state transition information 312, formatted as indicated in FIG. 4, is suitable for enabling a formal verification tool to perform a breadth-first verification that can uncover circuit behavior that was undetected during simulation. In one embodiment, for example, the extracted transition information 312 may be sorted according to present state information 404 such that data points associated with the same present state 404 are grouped together to facilitate a breadth-first verification technique. State transition information 312 is preferably extracted from the simulation trace 308 produced by simulator 306 using an extractor 310. In the preferred embodiment, extractor 310 comprises a software module designed to identify state transition information embedded in simulation trace 308 and store the state transition information in a suitable file or container. While the present invention contemplates the generation of a software module suitable for use as extractor 310, it will be readily appreciated that extractor 310 is suitable for use on essentially any simulation trace 308 produced by simulator 306 regardless of the complexity of the circuit model 302 under verification. Contrasted with the prospect of generating an environment around design for each unique circuit model 302, as is done in conventional formal verification methods, the implementation of a reusable extractor module 310 beneficially provides the ability to extend the verification coverage of essentially any digital circuit that has been simulated. Extractor 310 may be invoked periodically to incrementally update state transition information 312 as more and more simulation is performed. Model checker 314 is used to perform a formal verification of state transition information 312. Periodically as well, model checker 314 may be invoked to perform a rigorous or formal verification of state transition information 312 to provide the fullest possible verification of the digital circuit using the information generated with the simulator 306. In one embodiment, it is contemplated that simulator 306, extractor 310, and model checker 314 each comprise a software module including instruction means suitable for execution by one or more processors in a computer system as discussed in greater detail below.

Figures 5, 5A:
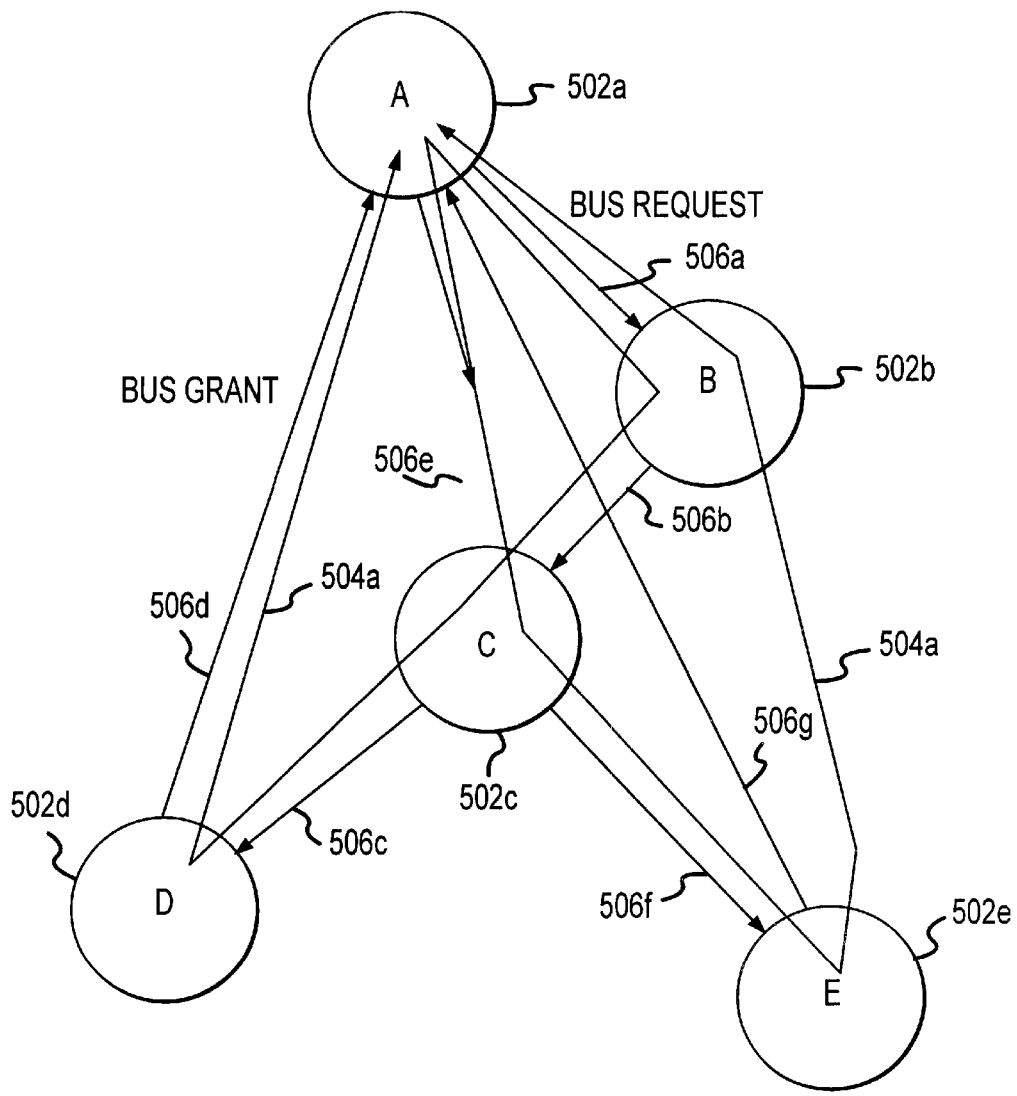
FIG. 5 is a state transition diagram emphasizing the discovery of a new transition path using the method of FIG 1.
Figure 6:
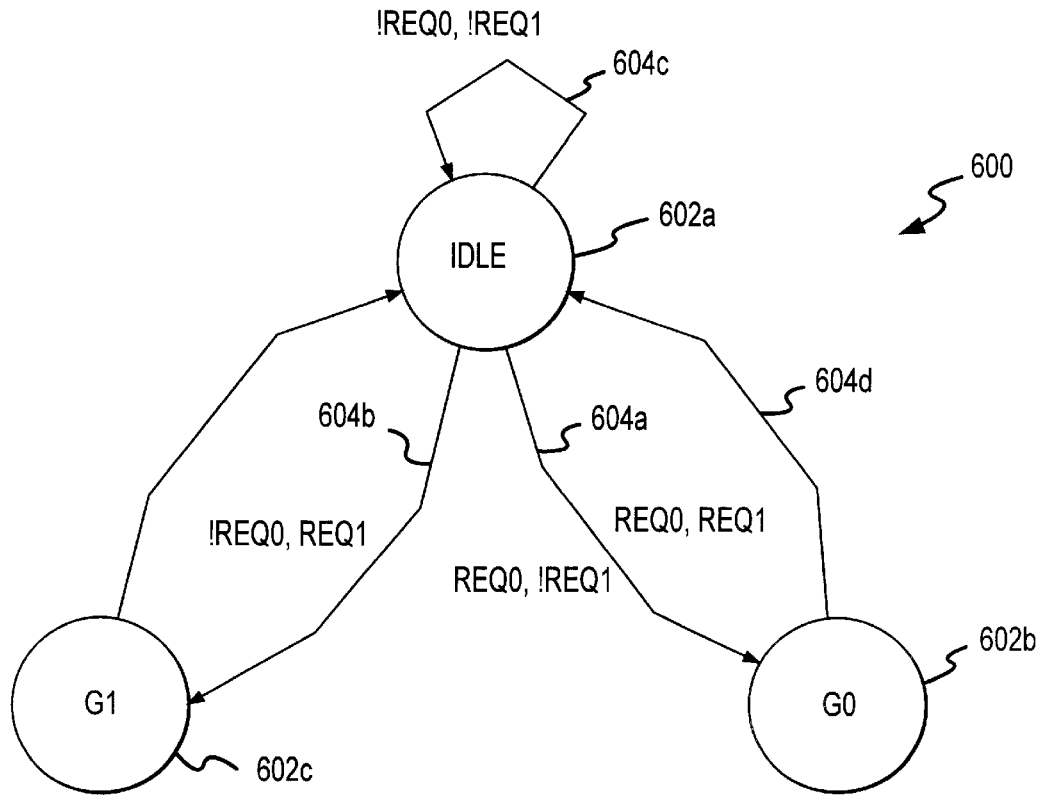
FIG. 6 is a flow diagram emphasizing the discovery of an infinite loop or live lock condition with the method of FIG. 2.

Turning now to FIG. 5 and FIG. 6, illustrations of the enhanced or extended verification coverage provided by the verification method according to the present invention are illustrated. FIG. 5 illustrates a simplified state transition diagram in which a digital circuit is represented by five possible states identified in FIG. 5 by reference numerals 502a, 502b, 502c, 502d, and 502e. A simulation tool is utilized to generate a first simulation trace 504a representing the transition path from state 502a to 502b via transition path 506a, a second transition path 506b from state 502b to state 502c, a third transition path 506c from state 502c to state 502d, and a fourth transition path 506d from state 502d to state 502a. A bus request is generated during first transition path 506a from state 502a to state 502b. A bus grant is issued in fourth transition path 506d from state 502d to state 502a. A second simulation trace 504b is then generated. Second simulation trace 504b includes a transition 506e from state 502a to state 502c, a transition path 506f from 502c to state 503e, and a final transition path 506g from state 502e to state 502a. The combination of the first simulation trace 504a and the second simulation trace 504b result in the generation of the state transition information 512 indicated in FIG. 5a. A full formal verification of the circuit represented by state transition information 512 can be accomplished using a conventional formal verification tool to derive transition paths that were not explicitly simulated. In the depicted example, as an illustration, a full verification of state transition information 512 would uncover a possible transition path from state 502a to state 502b via transition path 506a, from state 502b to state 502c via transition path 502b, a transition from state 502c to state 502e via transition path 506f, and a final transition from state 502e to state 502a via transition path 506g. This newly discovered and unsimulated transition path may be compared against a set of one or more specifications or rules to verify the proper operation of the digital circuit. As an example, if a rule exists that states that a bus request must be granted, it can be seen that first simulation trace 504a fulfills the rule in that a bus request granted during the transition from state 502a to state 502b is granted during the transition from state 502d to 502a. The second transition path, which includes no bus request at all, also does not violate the specification under consideration because no bus grant is required when no bus request is issued. The transition path uncovered by applying a formal verification to this state transition information 512, however, reveals a transition path that includes a bus request in the transition from state 502a to state 502b but fails to include a corresponding bus grant. In other words, because the transition path returns to its initial state without issuing a bus grant corresponding to the bus request, the formal verification tool has discovered a violation of the rule in an unsimulated transition path. It will be appreciated that, as the number of potential states in transition paths increases, the verification coverage possible with simulation tools get increasingly smaller the concept of applying a formal verification tool to the state transition information available as a result of the simulation process becomes increasingly beneficial.

Turning now to FIG. 6, a simple illustration of an infinite loop or live lock condition that may go undetected in a conventional simulation is depicted. In this example, the digital circuit is represented by three states, namely, idle state 602a, G0 state 602b, and G1 state 602c. The digital circuit 600 represented by the state diagram of FIG. 6 includes two inputs req0 and req1. The transition paths indicate that if req0 is asserted and req1 left unasserted, the digital circuit 600 transitions from idle state 602a to G0 state 602b in which the req0 is granted. From G0 state 602b, digital circuit 600 transitions back to idle state 602a. If req1 is asserted while req0 is left unasserted, digital circuit 600 transitions from idle state 602a to G1 state 602c. Thereafter, the digital circuit 600 transitions from G1 state 602c to idle state 602a. While req0 and req1 remain unasserted, digital circuit 600 remains in idle state 602a as indicated by the transition path 604c. Finally, if req0 and req1 are simultaneously asserted, transition path 604a indicates that req0 is given priority and digital circuit 600 transitions from idle state 602a to G0 state 602b. A simulation is then run to verify a rule that requires that a req0 be granted with a G0 state and a req1 be eventually granted with a G1 state. The simulation trace generated by a conventional simulation technique may conclude that digital circuit 600 does not violate the rule. More specifically, consider an input sequence to a simulation tool in which req0 is de-asserted each time digital circuits 600 transitions to the G0 state 602b. If req0 is de-asserted during the return transition path 604d from G0 state 602b to idle state 602a, the req1 request, if asserted, will eventually be satisfied with a transition to G1 state 602c. However, a formal verification of the state transition information generated by a simulation tool would quickly identify the existence of an infinite loop in which digital circuit 600 transitions from idle state 602a in response to req0 to G0 state 602b and back to idle state 602a via the return transition path 604d. Because this infinite loop is independent of the state of req1, the formal verification tool will report an error condition in which the possibility exists that asserting req1 will not result in a transition to G1 state 602c. This type of infinite loop situation is commonly referred to as a live lock. The present invention contemplates the discovery of live lock conditions that are difficult if not impossible to detect using conventional simulation. Thus, FIG. 5 and FIG. 6 highlight the improved verification coverage afforded by extracting simulation state transition information and applying a formal verification tool to the extracted information to improve the verification coverage over the verification coverage provided by the simulation tool alone.

Figure 7:
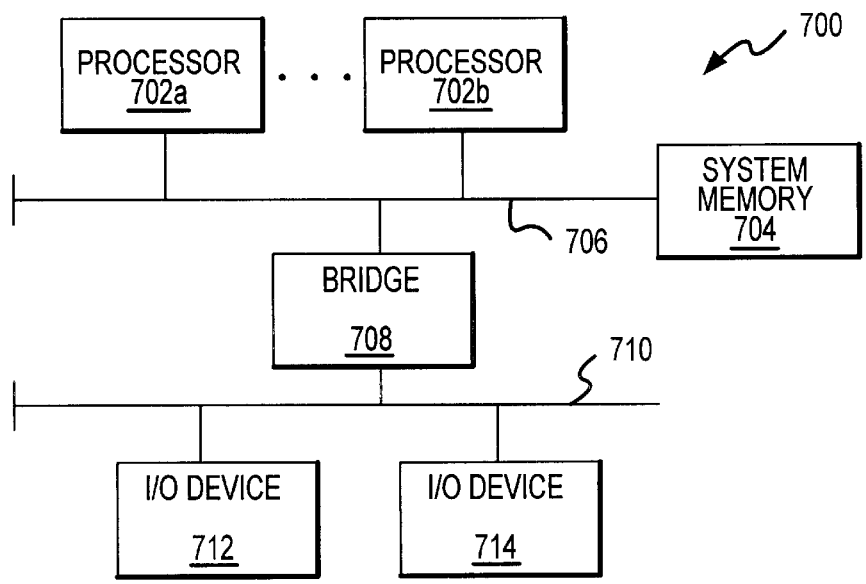
FIG. 7 is a simplified block diagram of a computer system suitable for implementing the method of FIG. 2.

Turning now to FIG. 7, a computer system 700 suitable for implementing the verification system and method described above is presented. Computer system 700 includes one or more processors indicated in FIG. 7 by reference numerals 702a and 702n (collectively or generically referred to herein as processor 702). Processor 702 may be compatible with any of a variety of commercially distributed processor families including, without limitation, the RS/6000 family of processors available from IBM Corporation, the PowerPC family of processors available from IBM Corporation, the 68000 family of processors available from Motorola, as well as x86 compatible family of processors available from a number of sources. In the embodiment depicted in FIG. 7, processor 702 communicates with a system memory 704 via a system bus 706. Thus, it will be appreciated by those familiar with microprocessor based computer design, that the depicted embodiment of computer system 100 is implemented as a symmetric multiprocessor (SMP) machine in which each processor 702 has essentially equivalent access to system memory 704. Alternative architectures in which computer system 700 maybe implemented include non-uniform memory architectures (NUMA) systems in which the system memory is distributed such that each processor 702 has relatively inexpensive or fast access to a local portion of the system memory and slower or relatively more expensive access to the portions of system memory local to the remaining processors. The depicted embodiment of computer system 700 further includes one or more bridges 708 (only one of which is shown in the depicted embodiment) coupled between system bus 706 and I/O bus 710. Peripheral devices including an input device 712 and a display device 714 communicate with system bus 706 via the one or more bridges 708. Input device 712 may include, for example, a keyboard or pointing device such as a computer mouse. A wide variety of additional I/O devices, not depicted, are typically incorporated in computer system 700 including, for example, hard disk controllers, graphics adapters, high-speed network controllers, and audio adapters. I/O bus 710 may comply with any of a variety of industry standard I/O bus architectures including, as examples, the PCI, AGP, MCA, ISA, & EISA architectures. In addition, computer system 700 may include multiple I/O busses wherein a first I/O bus complies with one of the I/O bus architectures while a second bus is compliant with a second I/O bus architecture. One embodiment of the present invention is implemented as a set or sequence of encoded instructions suitable for execution by processors 702. The computer encoded instructions are typically residing in system memory 704 when the computer instructions are being executed. Prior to being stored in system memory 704, the computer instructions may be encoded on any of a variety of other storage mediums including, as examples, a hard disk, a floppy disk device, a CD-ROM, or a DVD storage device. While the computer instructions may reside in a single computer system such as a computer system 700, another embodiment contemplates a network of systems similar to computer system 700 interconnected via a local area network or a wide area network.

Thus, it will be appreciated by those skilled in the art having the benefit of this disclosure, that the present invention contemplates achieving improved verification of digital circuit designs with only an incremental increase in resources by combining and leveraging the information and capabilities of existing verification tools. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A method of verifying a digital circuit, comprising:
    extracting state transition information from information produced by simulating a first state transition sequence and a second state transition sequence of the digital circuit;
    applying a verification tool to the extracted state transition information to verify at least one state transition sequence other than the first and second state transition sequence.

2. The method of claim 1, further comprising, prior to the extracting of state transition information, simulating the first and second state transition sequences.

3. The method of claim 2, wherein the verification tool comprises a model checker.

4. The method of claim 3, wherein the information from which the state transition information is extracted comprises an all events trace produced by using the simulation technique to execute a plurality of simulation runs.

5. The method of claim 1, wherein the applying of the formal verification tool comprises applying a model checker to the extracted state transition information.

6. The method of claim 1, wherein the state transition information includes a set of data points each including corresponding present state, present input, and next state information.

7. The method of claim 6, wherein the extracting of the state transition data includes sorting the state transition data by the present state information.

8. The method of claim 7, wherein the simulating the first state transition verifies satisfaction of a rule traversing a first transition path and simulating the second state transition verifies satisfaction of a rule traversing a second transition path and wherein the formal verification tool is suitable for verifying satisfaction of the rule traversing a third transition path comprised from elements of the first transition paths.

9. The method of claim 1, wherein the formal verification tool is suitable for discovering the presence of an infinite loop transition path from the state transition information.

10. A computer program product, stored on a computer readable medium and suitable for executing on a computer, for verifying a digital circuit, the computer program product comprising:

computer useable code means for extracting state transition information from information produced by simulating a first state transition sequence and a second state transition sequence of the digital circuit;
    computer useable code means for applying a verification tool to the extracted state transition information to verify at least one state transition sequence other than the first and second state transition sequence.

11. The computer program product of claim 10, further comprising, computer useable code means for simulating the first and second state transition sequences.

12. The computer program product of claim 11, wherein the verification tool comprises a model checker.

13. The computer program product of claim 12, wherein the information from which the state transition information is extracted comprises an all events trace produced by using the simulation technique to execute a plurality of simulation runs.

14. The computer program product of claim 10, wherein the computer useable code means for applying the formal verification tool comprises computer useable code means for applying a model checker to the extracted state transition information.

15. The computer program product of claim 10, wherein the state transition information includes a set of data points, wherein each of the set of data points includes corresponding present state, present input, and next state information.

16. The computer program product of claim 15, wherein the computer useable code means for extracting of the state transition data includes computer useable code means for sorting the state transition data by the present state information.

17. The computer program product of claim 16, wherein the simulating the first state transition verifies satisfaction of a rule traversing a first transition path and simulating the second state transition verifies satisfaction of a rule traversing a second transition path and wherein the formal verification tool is suitable for verifying satisfaction of the rule traversing a third transition path comprised from elements of the first transition paths.

18. The computer program product of claim 10, wherein the formal verification tool is suitable for discovering the presence of an infinite loop transition path from the state transition information.

19. A computer system including processor, memory, input, and display, the memory configured with computer useable code means for:
    extracting state transition information from information produced by simulating a first state transition sequence and a second state transition sequence of the digital circuit;
    applying a verification tool to the extracted state transition information to verify at least one state transition sequence other than the first and second state transition sequence.

20. The system of claim 19, further comprising, prior to the extracting of state transition information, simulating the first and second state transition sequences.

21. The system of claim 20, wherein the verification tool comprises a model checker.

22. The system of claim 21, wherein the information from which the state transition information is extracted comprises an all events trace produced by using the simulation technique to execute a plurality of simulation runs.

23. The system of claim 19, wherein the applying of the formal verification tool comprises applying a model checker to the extracted state transition information.

24. The system of claim 19, wherein the state transition information includes a set of data points each including corresponding present state, present input, and next state information.

25. The system of claim 24, wherein the extracting of the state transition data includes sorting the state transition data by the present state information.

26. The system of claim 25, wherein the simulating the first state transition verifies satisfaction of a rule traversing a first transition path and simulating the second state transition verifies satisfaction of a rule traversing a second transition path and wherein the formal verification tool is suitable for verifying satisfaction of the rule traversing a third transition path comprised from elements of the first transition paths.

27. The system of claim 19, wherein the formal verification tool is suitable for discovering the presence of an infinite loop transition path from the state transition information.

* * * * *